(12) United States Patent
Vashchenko et al.

(10) Patent No.: US 7,718,480 B1
(45) Date of Patent: May 18, 2010

(54) ESD CLAMPS AND NMOS ARRAYS WITH INCREASED ELECTRICAL OVERSTRESS ROBUSTNESS

(75) Inventors: Vladislav Vashchenko, Palo Alto, CA (US); Marcel ter Book, Pleasanton, CA (US); Peter J. Hopper, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 2 days.

(21) Appl. No.: 11/138,221

(22) Filed: May 26, 2005

(51) Int. Cl.
*H01L 21/00* (2006.01)

(52) U.S. Cl. .................. 438/193; 438/197; 438/199; 257/E29.04; 257/E29.063; 257/E29.255; 257/E29.325

(58) Field of Classification Search ............... 438/275, 438/301, 193, 197, 199, 574, 579, 133, 135; 257/E29.04, E29.063, E29.255, E29.325
See application file for complete search history.

(56) References Cited

U.S. PATENT DOCUMENTS

| | | | | |
|---|---|---|---|---|
| 5,477,413 A * | 12/1995 | Watt | ............................. | 361/56 |
| 5,689,133 A * | 11/1997 | Li et al. | ........................ | 257/361 |
| 5,719,733 A * | 2/1998 | Wei et al. | ....................... | 361/56 |
| 5,751,825 A * | 5/1998 | Myers et al. | ................. | 381/118 |
| 5,953,601 A * | 9/1999 | Shiue et al. | .................. | 438/200 |
| 6,063,672 A * | 5/2000 | Miller et al. | ................. | 438/275 |
| 6,258,672 B1 * | 7/2001 | Shih et al. | ..................... | 438/275 |
| 6,288,884 B1 * | 9/2001 | Yu | ............................. | 361/111 |
| 6,320,230 B1 * | 11/2001 | Yu | ............................. | 257/355 |
| 6,368,922 B1 * | 4/2002 | Yu | ............................. | 438/275 |
| 6,444,510 B1 * | 9/2002 | Hu et al. | ...................... | 438/197 |
| 6,476,443 B1 * | 11/2002 | Kinzer | ........................ | 257/329 |
| 6,611,028 B2 * | 8/2003 | Cheng et al. | ................. | 257/361 |
| 6,670,245 B2 * | 12/2003 | Yu | ............................. | 438/275 |
| 6,788,507 B2 * | 9/2004 | Chen et al. | ..................... | 361/56 |
| 6,800,516 B2 * | 10/2004 | Chan et al. | ................... | 438/197 |
| 6,979,580 B2 * | 12/2005 | King | ........................... | 438/17 |
| 6,998,685 B2 * | 2/2006 | Manna et al. | ................ | 257/357 |
| 7,141,831 B1 * | 11/2006 | Vashchenko et al. | ......... | 257/124 |
| 7,285,805 B1 * | 10/2007 | Vashchenko et al. | ......... | 257/173 |
| 7,298,599 B1 * | 11/2007 | Vashchenko et al. | .......... | 361/56 |
| 2003/0047787 A1 * | 3/2003 | Cheng et al. | ................. | 257/360 |
| 2003/0174452 A1 * | 9/2003 | Chen et al. | ..................... | 361/56 |
| 2004/0104437 A1 * | 6/2004 | Zecri et al. | .................... | 257/362 |
| 2005/0045952 A1 * | 3/2005 | Chatty et al. | ................. | 257/355 |
| 2005/0056896 A1 * | 3/2005 | Manna et al. | ................ | 257/356 |
| 2007/0120190 A1 * | 5/2007 | Schwantes et al. | .......... | 257/355 |
| 2008/0259511 A1 * | 10/2008 | Worley | ........................ | 361/56 |

* cited by examiner

*Primary Examiner*—Michael S Lebentritt
(74) *Attorney, Agent, or Firm*—Jurgen Vollrath

(57) ABSTRACT

In an NMOS active clamp device and an NMOS active clamp array with multiple source and drain contacts, the robustness against ESD events is increased by reducing channel resistance through the inclusion of one or more p+ regions formed at least partially in the source and electrically connected to the one or more source contacts.

4 Claims, 2 Drawing Sheets

ESD CLAMPS AND NMOS ARRAYS WITH INCREASED ELECTRICAL OVERSTRESS ROBUSTNESS

FIELD OF THE INVENTION

The present invention deals with ESD clamps. In particular, it deals with active NMOS clamps.

BACKGROUND OF THE INVENTION

Numerous devices have been developed for handling electrostatic discharge (ESD) events. In the case of NMOS devices the ESD clamps fall into two groups: the active clamps that work in normal operating mode, and the snapback devices which are designed to be triggered and operate in snapback mode during an ESD event and then turn off again as voltage drops below the holding voltage of the device.

The present invention deals with active clamp NMOS devices. These are typically larger than snapback devices but have the advantage of being usable as self-protecting devices, where they are functional even during non-ESD situations. While these devices typically are meant not to go into snapback, local overstresses due to current crowding can cause these devices to go into snapback, thereby damaging the device.

The present invention seeks to reduce such snapback in active NMOS clamps.

SUMMARY OF THE INVENTION

According to the invention there is provided a method of reducing active clamp NMOS breakdown caused by entering snapback mode by reducing the channel resistance of the NMOS device. The NMOS device typically includes a p-well contact, and reduction of the channel resistance typically involves reducing the resistance between the p-well contact and the source of the NMOS device. In one embodiment, this is achieved by introducing a p+ region into the source, having a common contact with the source. In the case of an array of active NMOS clamps, multiple p+ regions are introduced into the array and connected to the source contacts. The p+ regions with their contacts may be interspersed between the source contacts. The spacing between the p+ regions and the polygate of the NMOS device may be adjusted to either have the p+ regions spaced from the polygate or to overlap with the polygate, thereby extending at least partly under the polygate.

Further, according to the invention, there is provided an active clamp NMOS device comprising a polygate, an n+ drain regions formed in a p-well or p-substrate to one side of the polygate, and an n+ source region formed in the p-well or p-substrate to the other side of the polygate, each of the drain and source regions having at least one contact, the device further comprising at least one p+ region formed at least partially in the source region and extending up to or partially under the polygate, the one or more p+ regions each having a contact connected to the one or more source contacts.

Still further, according to the invention, there is provided an array of active clamp NMOS devices, each device comprising a polygate, an n+ drain region formed in a p-well or p-substrate and having multiple drain contacts, an n+ source region formed in the p-well or p-substrate and having multiple source contacts distributed along the width of the polygate, and one or more p+ regions interspersed between the source contacts and extending up to or partially under the polygate, the p+ regions having contacts connected to the source contacts.

DETAILED DESCRIPTION OF THE INVENTION

In order to increase the robustness of active clamp NMOS devices under ESD events and avoid the devices going into snapback, the present invention proposes increasing the current required before the device goes into snapback. The total resistance of an NMOS device can be considered as comprising the drain resistance, the source resistance and the channel resistance, of which the channel resistance plays the most significant part. The present invention therefore proposes reducing the channel resistance by reducing the resistance between the p-well contact of the NMOS device and the source.

Figure 1:
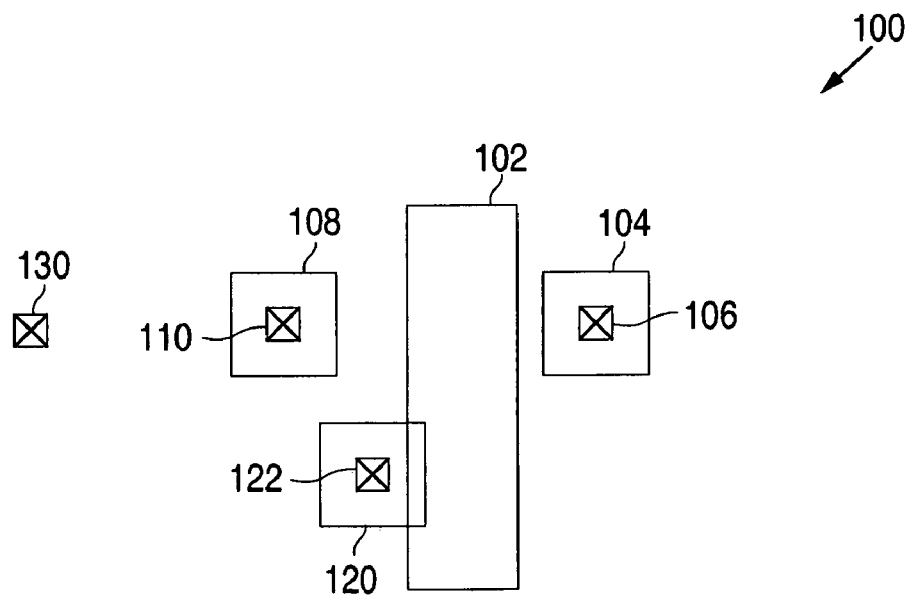
FIG. 1 shows a top view of one embodiment of an active clamp NMOS device of the invention.

One embodiment for achieving this is shown in FIG. 1, which shows an NMOS device 100 with a polygate 102, a drain 104 with drain contact 106 on one side of the polygate 102, and a source 108 with source contact 110 on the other side of the polygate 102. In accordance with the invention, a p+ region 120 with p+ region contact 122 is provided that extends partly under the polygate 102 as shown in FIG. 1. The contact p+ region contact 122 is electrically connected to the source contact 110. This may be achieved by providing the source and p+ region with a common contact.

In this way the present invention provides for a lower resistance between p-well contact 130 and source 108, thereby increasing the current required to cause the device to go into snapback, and thus making the device more robust to withstand ESD events.

A common implementation of an active clamp NMOS device is in the form of an array. The present invention lends itself to providing a more robust array by interspersing p+ regions between the source contacts as shown in the embodiments of FIGS. 2-5.

Figure 2:
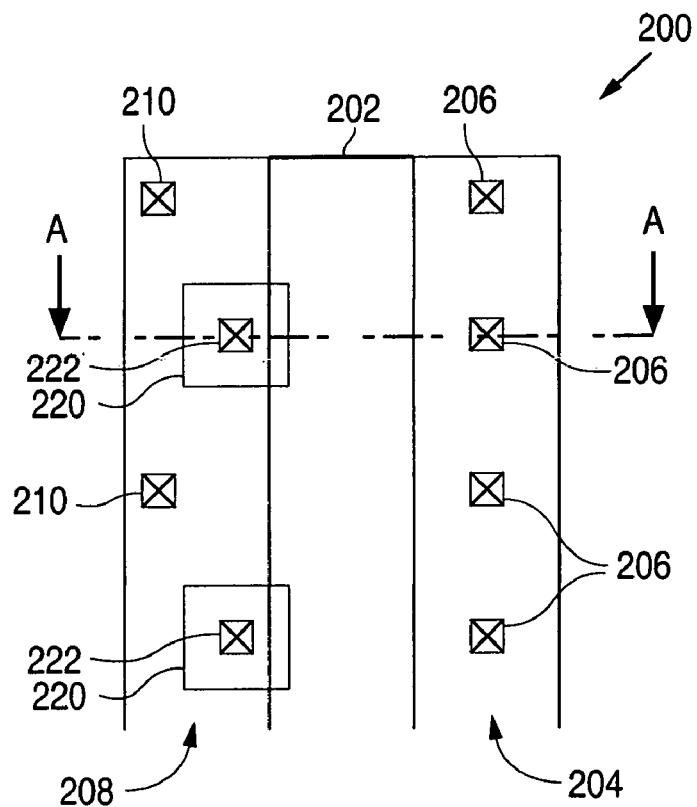
FIG. 2 shows a top view of one embodiment of a high overstress active clamp NMOS device array of the invention.

FIG. 2 shows a top view of one embodiment of such an array 200 with a polygate 202, a drain region 204 having multiple drain contacts 206, and a source region 208 with multiple source contacts 210. Interspersed between the source contacts 210 are p+ regions 220 having contacts 222. As shown, in this embodiment the p+ regions 220 extend partly under the polygate 202. This is shown also in the cross section of FIG. 4. It will be appreciated that the vertical depth of the p+ regions 220 and depth of the source 208 into the well, as shown in FIG. 2, is by way of example only and that the p+ regions 220 could instead extend deeper into the well in a vertical direction than the source 208 but typically they will be of similar depth. Again, in this embodiment, the p+ region contacts 222 and source contacts 210 are electrically connected.

Figure 4:
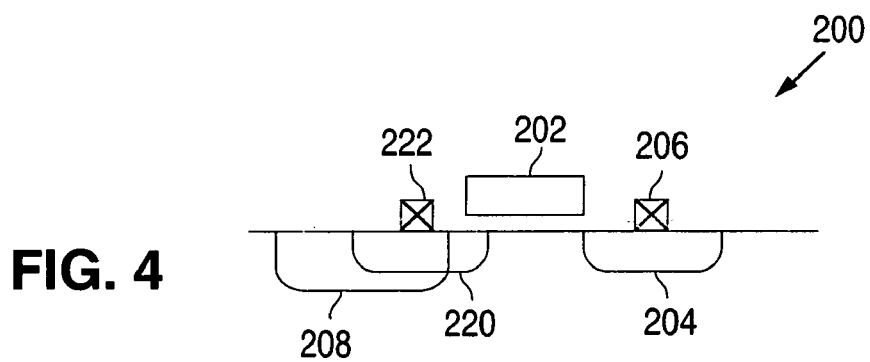
FIG. 4 shows a cross section through the device of FIG. 2 along the line A-A.

It will be appreciated that the embodiment of FIGS. 2 and 4 is only one example of how the invention can be implemented. For instance, the p+ regions need not be formed between all of the adjacent source contacts—fewer p+ regions could be formed. It will also be appreciated that in practice arrays typically include more than one polygate, each with drain and source regions. In such a case, p+ regions would be formed between source contacts of the sources associated with each of the polygates. Also, while FIGS. 2 and 4 show the p+ regions 220 extending under the gate, this embodiment covers all situations where the p+ regions are not spaced laterally from the gate but either extend up to the gate or extend some distance below the gate.

Figure 3:
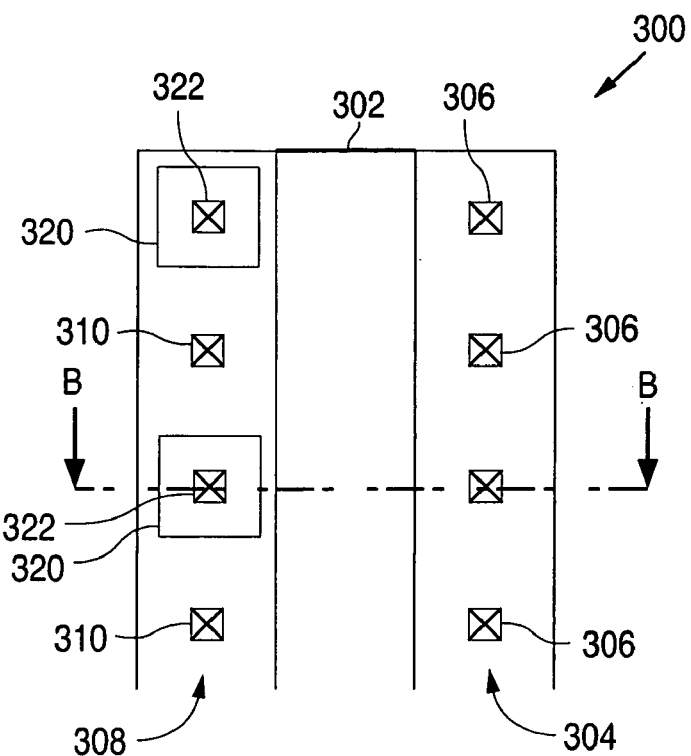
FIG. 3 shows a top view of another embodiment of a high overstress active clamp NMOS device array of the invention.
Figure 5:
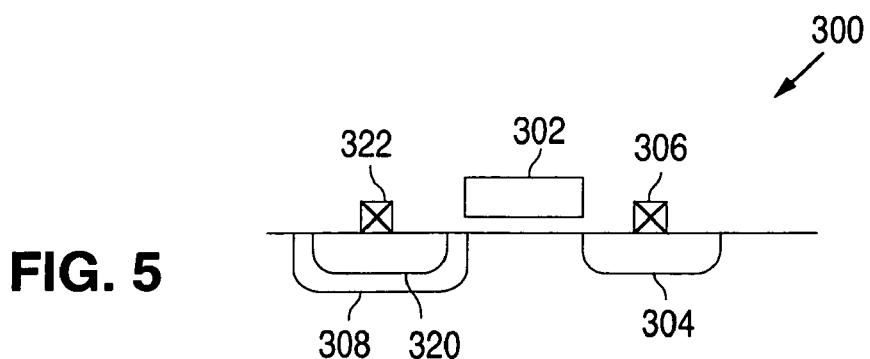
FIG. 5 shows a cross section through the device of FIG. 3 along the line B-B.

Another embodiment of an array is shown in FIGS. 3 and 5, which show an array 300 with polygate 302, drain 304 with drain contacts 306, and source 308 with source contacts 310. In this embodiment the p+ regions 320 formed between the source contacts 310 are spaced laterally from the gate 302. In particular the p+ regions 320 are formed so that the contacts 322 of the p+ regions are substantially in line with the source contacts 310 and the p+ regions do not extend up to or under the polygate 302. While the particular structure shown in this embodiment with p+ regions spaced from the polygate has been considered internally by National Semiconductor Corporation (the assignee of the present invention) in the past for purposes of addressing unreliable circuit operation on inductive loads, the use of p+ regions for providing more robustness against ESD events and, more generally, the particular placement of the p+ regions shown in FIG. 2 has not been considered before.

The present invention provides the additional benefit that the p+ regions, by being interspersed between the source contacts of the source does not increase the area of the array and avoids the need to redesign the entire clamp.

While particular embodiments have been discussed, it will be appreciated that the invention could be implemented in other ways to reduce the possibility of snapback in an active NMOS clamp.

What is claimed is:

1. A method of reducing the likelihood that an active, lateral clamp NMOS device enters snapback mode, the device including a drain with a drain contact, and a source with a source contact, a polygate formed over a channel region between the drain and source, the drain and source being laterally arranged relative to each other and formed in a p-well or p-substrate, comprising reducing the channel resistance of the NMOS device by reducing the resistance between a contact to the p-well or substrate, and the source of the NMOS device by introducing a p+ region with a p+ region contact into the source so that the p+ region extends at least up to the polygate, wherein the p+ region contact is electrically connected to the source contact.

2. A method of claim 1, wherein, in the case of an array of active NMOS clamps with multiple source contacts, multiple p+ regions are introduced into the array and connected to the source contacts.

3. A method of claim 2, wherein the p+ regions with their contacts are interspersed between the source contacts.

4. A method of claim 3, wherein the p+ regions extend partially underneath the polygate.

* * * * *

UNITED STATES PATENT AND TRADEMARK OFFICE
CERTIFICATE OF CORRECTION

| | | |
|---|---|---|
| PATENT NO. | : 7,718,480 B1 | Page 1 of 1 |
| APPLICATION NO. | : 11/138221 | |
| DATED | : May 18, 2010 | |
| INVENTOR(S) | : Vladislav Vashchenko et al. | |

It is certified that error appears in the above-identified patent and that said Letters Patent is hereby corrected as shown below:

On the cover page of the patent, at (75) Inventors: Remove "Marcel ter Book" and insert -- Marcel ter Beek --.

Signed and Sealed this
Eighteenth Day of January, 2011

David J. Kappos
*Director of the United States Patent and Trademark Office*